US006275093B1

(12) United States Patent
Shekhawat et al.

(10) Patent No.: US 6,275,093 B1
(45) Date of Patent: *Aug. 14, 2001

(54) IGBT GATE DRIVE CIRCUIT WITH SHORT CIRCUIT PROTECTION

(75) Inventors: Sampat Singh Shekhawat, Mountaintop; Jon Gladish, Pittston; Anup Bhalla, Wilkes-Barre, all of PA (US)

(73) Assignee: Intersil Corporation, Palm Bay, FL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/030,871

(22) Filed: Feb. 25, 1998

(51) Int. Cl.[7] .................................................. H03K 17/687
(52) U.S. Cl. .......................... 327/434; 327/432; 327/440; 361/89; 361/91.3; 361/91.8; 361/18
(58) Field of Search ..................................... 327/419, 432, 327/440, 434, 387–389, 318, 319; 361/111, 18, 88, 89, 91.3, 91.5, 90, 91.8, 91.6; 323/275, 276

(56) References Cited

U.S. PATENT DOCUMENTS 5,559,656  *  9/1996  Chokhawala ............................ 361/18
5,898,554  *  4/1999  Schnetzka et al. .................... 361/18

OTHER PUBLICATIONS

Toshiba, "GTR Module (IGBT) Application Notes", *Toshiba Corporation*, pp. 75–81 (1992).
A. Bhalla, et al., "IGBT Behavior During Desat Detection and Short Circuit Fault Protection", Proceedings of 1998 International Symposium on Power Semiconductor Devices & ICs, Kyoto, Harris Semiconductor, pp. 11.11–11.14, (1998).

* cited by examiner

Primary Examiner—Timothy P. Callahan
Assistant Examiner—Minh Nguyen
(74) Attorney, Agent, or Firm—Jaeckle Fleischmann & Mugel, LLP

(57) ABSTRACT

An IGBT gate driver circuit includes means for detecting when the collector-to-emitter voltage (Vce) of a turned-on IGBT, intended to be operated in the saturation region, increases above a preset level, indicative of a fault condition, such as a short circuit. In response to such an increase in the Vce of a turned on IGBT, the IGBT is turned-off in two steps. First, the turn-on gate drive is decreased to a level that is still above the threshold (turn-on) voltage of the IGBT in order to decrease the current flowing through the IGBT and hence, the peak power dissipation. This decrease in the current through the IGBT and the peak power dissipation increases the length of time the IGBT can withstand a fault condition such as a short circuit. Then, after decreasing the gate drive to the IGBT, the gate drive is gradually decreased until the IGBT is completely turned off.

16 Claims, 5 Drawing Sheets

IGBT GATE DRIVE CIRCUIT WITH SHORT CIRCUIT PROTECTION

BACKGROUND OF THE INVENTION

This invention relates to insulated gate bipolar transistors (IGBTs) and, in particular, to an apparatus and method for protecting an IGBT when it is subjected to a short circuit, or like, condition.

To better explain the problems faced by Applicants and Applicants' invention, reference will first be made to FIG. 1A which shows a standard symbol for an N-conductivity type IGBT and to FIG. 1B which shows its simplified equivalent circuit. Thus, FIG. 1A shows that an IGBT, T1, has a gate electrode 1, a collector electrode 2 (which may also be referred to as the anode), and an emitter electrode 3 (which may also be referred to as the cathode). The equivalent circuit of FIG. 1B shows that the IGBT may be represented by an insulated-gate-field-effect transistor (IGFET) portion, F1, which controls the turn-on and turn-off of a semiconductor structure which may be represented by a vertical PNP bipolar transistor P1 and a parasitic NPN bipolar transistor N1. The IGFET portion includes a gate electrode (Gate), connected to a terminal 1. The potential applied to the gate electrode controls the conductivity of a conduction channel (R-channel) defined at one end by a (drain) region 21 and at its other end by a (source) region 22. The gate electrode overlies the conduction channel formed within a substrate region 23 which, in FIG. 1B, is shown connected to the source region 22. The potential applied to the gate electrode 1 is intended to control the turn-on and turn-off of transistor P1. The emitter of P1 is connected to terminal 2 which defines the "collector" of the IGBT. The base of P1 is connected to the collector of N1 and via a resistor (MOD) to region 21, which defines one end of the conduction path (R-channel) of the IGFET portion of F1. Region 22 of the FET, which defines the other end of the conduction path of the channel, is connected to the substrate region 23 of the FET and to the emitter of N1 at the IGBT "emitter" terminal 3. The collector region of P1 is connected to the base of N1. A parasitic resistor Rp which has a very low value of resistance is shown connected between the base and emitter of N1. The parasitic resistance normally shunts most of the P1 collector current (I1). However, if the emitter-to-collector current $I_1$ through P1 becomes very large, as may be the case under short circuit condition, then N1 may be driven into a high conductive state and the thyristor portion (P1, N1) of the IGBT may latch up and the FET portion (F1) may lose control.

In normal operation, for any N-type IGBT, a turn-on voltage applied to the gate of the IGBT must be positive relative to the emitter and must exceed the threshold voltage (VT) of the IGBT. By way of example, in the description to follow, it is assumed that VT is about 5 volts. However, VT may be more or less than 5 volts. In fact, the VT of presently available IGBTs ranges from 4 to 8 volts. When a turn-on voltage is applied to the gate of the IGBT, the base of transistor P1 is supplied (flows) via the channel of the FET portion F1. The base current of P1 is multiplied by the current gain of P1 which then conducts a current $I_1$ from the emitter electrode of P1 (terminal 2) along the main conduction path of P1 and via parasitic resistor Rp (which is extremely small) into the electrode defined as terminal 3 (the "emitter" electrode of the IGBT in the drawing). However, if the current $I_1$ rises dramatically, and the voltage at the base of transistor N1 rises above the 0.7–1.0 volt range, some of the $I_1$ current will be supplied into the base of N1. The base current into N1 causes N1 to conduct a collector current ($I_2$) which is drawn out of the base of P1. If $I_1$ and $I_2$ are allowed to become too high, the FET portion of the IGBT (i.e., the gate) may lose control and P1 and N1 may latch up. Latch-up occurs when $I_1$ plus $I_2$ exceeds the latching current of the parasitic thyristor formed by P1, N1 and Rp.

As shown in FIG. 2, an IGBT, T1, is typically connected at its drain to one end of a load whose other end is connected to a power supply voltage (VBUS). VBUS may range from a few volts to several thousand volts and the load current (IL) through the load and the IGBT may range from the milliampere region to a hundred or more amperes. In order to minimize the power dissipation across the IGBT, a large turn-on voltage (e.g., 12–15 volts) is normally applied to the gate of the IGBT to cause the IGBT to be operated in the saturation region, with its collector-to-emitter voltage (Vce) equal to Vcesat, which is in the order of a few volts. However, a problem occurs if, when the IGBT is fully turned on and carrying a large current, the load is shorted. The IGBT is then subjected to an excessive power dissipation condition, due to the high current through the IGBT and the rising voltage developed across the collector-to-emitter of the IGBT. If the short circuit condition exists (or develops) and persists, the IGBT will fail due to the excessive power dissipation. As the IGBT is heated by the simultaneous presence of a large current through it and a large voltage across it, the voltage needed across the shunt resistor Rp to turn-on transistor N1 is dramatically reduced. This value may be 0.3–0.4v at 150° C. Furthermore, since carrier mobility degrades with temperature, the resistance Rp will increase as the device gets hotter. These factors and others conspire to increase the chances of latch-up if the short-circuit condition persists for too long before the device is turned-off.

It is therefore necessary to turn off an IGBT if, and when, a fault condition, such as a short circuit, develops or exists. Prior art schemes for turning-off an IGBT subjected to a short circuit condition rely on applying a relatively sharp turn-off voltage to the gate of the IGBT when a short circuit condition is sensed. However, it has been discovered that trying to turn-off an IGBT sharply and rapidly when the IGBT is carrying a very large current and is subjected to a short circuit condition, may cause the IGBT to lose control and fail. Thus, if the IGBT loses control over the load current flowing through it while its Vce keeps increasing, the IGBT will fail due to excessive power dissipation. Another scheme for turning-off an IGBT subjected to a short circuit condition, maintains the full turn-on voltage applied to the gate for a time interval of several microseconds after the detection of a short circuit condition in order to maintain control. During this time interval, the Vce of the IGBT rises towards the load supply voltage (VBUS). Following the time interval the turn-on voltage is removed. However, while the IGBT is on, its power dissipation is very high and the IGBT may fail due to excessive power dissipation.

The problems present in the prior art are significantly reduced in circuits embodying the invention.

SUMMARY OF THE INVENTION

Applicants' invention resides, in part, in the recognition that, an insulated gate bipolar transistor (IGBT) is designed to carry very large currents and that it is rated to withstand a very high power dissipation for a very short period of time. Applicants' invention also resides, in part, in the recognition that during this very short period of time, when an IGBT is subjected to a short circuit condition, it is safer to turn off the IGBT by first decreasing the gate drive of the IGBT from a high turn-on to a lower turn-on level (which is above the threshold voltage of the IGBT), so that the current through the IGBT is decreased, and to then slowly (but still during a very brief period of time) decrease the gate drive to the IGBT until it is shut off completely.

A gate driver circuit embodying the invention includes means for detecting when the collector-to-emitter voltage (Vce) of a turned-on IGBT, intended to be operated in the saturation region, increases above a preset level, indicative of a fault condition such as a short circuit, or similar, condition. In response to such an increase in the Vce of a turned on IGBT, the IGBT is turned-off in two steps. First, the turn-on gate drive is decreased to a level that is still above the threshold (turn-on) voltage of the IGBT in order to decrease the current flowing through the IGBT and hence, the peak power dissipation. By decreasing the current through the IGBT and its peak power dissipation, the length of time the IGBT can withstand a fault condition such as a short circuit, is increased. Then, after decreasing the gate drive to the IGBT, the gate drive is slowly decreased until the IGBT is completely turned off.

A circuit embodying the invention includes an insulated-gate bipolar transistor (IGBT) having first and second electrodes defining the ends of its main conduction path and a control electrode for the application thereto of a control voltage for turning the IGBT on and off. The first and second electrodes of the IGBT are intended to be connected in series with a load between a load power supply (VBUS) and a point of reference potential. In normal operation, a gate driver circuit applies a turn-on voltage to the control electrode of the IGBT which is significantly greater than the threshold voltage of the IGBT, for operating the IGBT in saturation and causing its Vce to be equal to its saturation voltage, which is in the order of a few volts. A voltage level sensing and control circuit is coupled between the first electrode of the IGBT and the gate driver circuit for, in response to the voltage at the first electrode exceeding the saturation voltage by a preset amount, decreasing the turn-on voltage applied to the control electrode of the IGBT by a given amount, while still maintaining the turn-on voltage to the IGBT greater than its threshold voltage, and for gradually decreasing the voltage applied to the control electrode below the threshold voltage of the IGBT in order to turn it off completely.

An advantage of gate drive circuits embodying the invention is that they allow for a high turn-on gate voltage to be applied under normal operating condition to ensure low conduction and switching losses in the IGBT, while providing for a safe turn-off of the IGBT under short circuit, or similar, conditions.

BRIEF DESCRIPTION OF THE DRAWINGS

In the accompanying drawing like reference characteristics denote like components.

DETAILED DESCRIPTION OF THE INVENTION

Figure 1A:
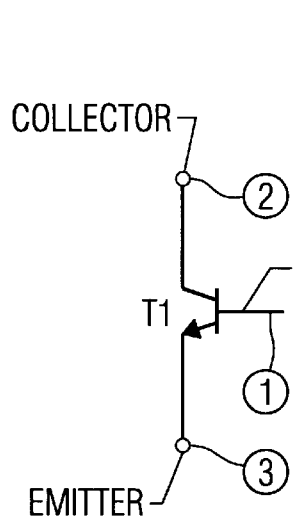
FIG. 1A is a symbolic representation of an IGBT.
Figure 1B:
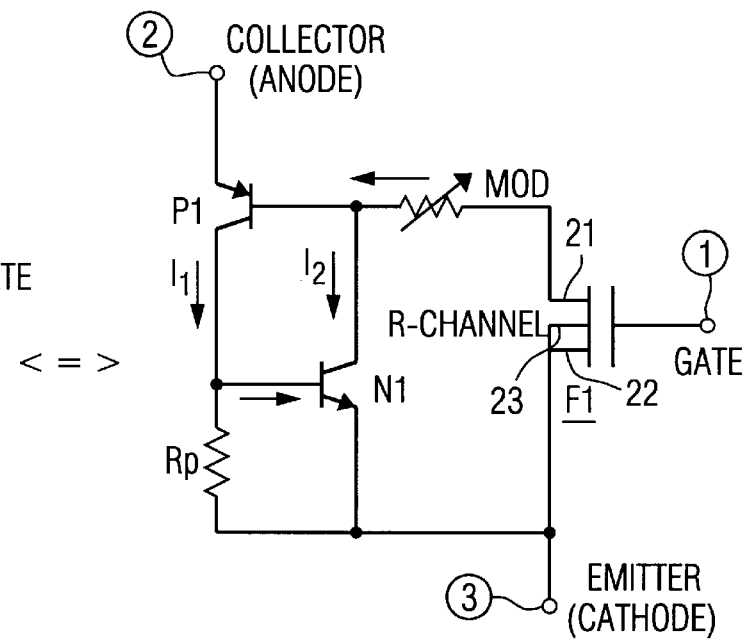
FIG. 1B is a simplified equivalent circuit of an IGBT.
Figure 2:
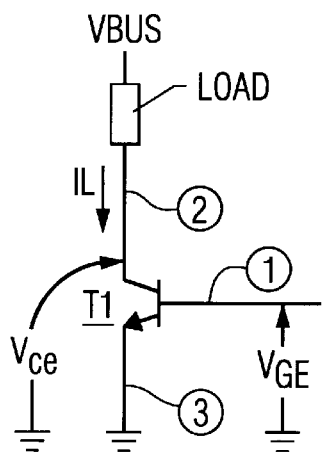
FIG. 2 is a schematic diagram of an IGBT connected to a load.
Figure 3:
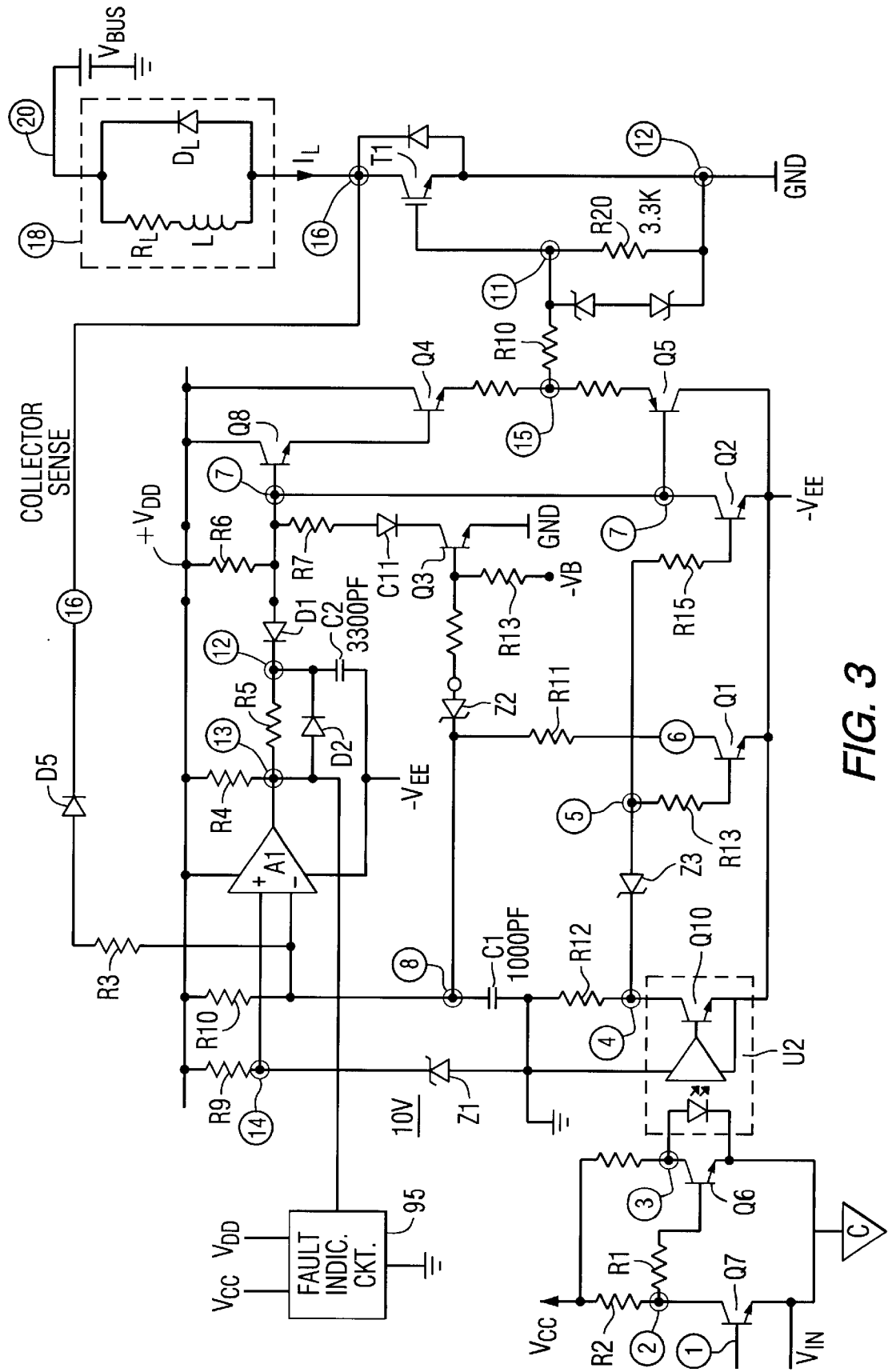
FIG. 3 is a schematic diagram of a circuit embodying the invention.

FIG. 3, which is a schematic diagram of a circuit embodying the invention, shows an IGBT, T1, connected at its emitter to a ground terminal 12, at its gate to a node 11 and at its collector to an output terminal 16. An inductive load 18 is connected between terminal 16 and a terminal 20 to which is applied the load power supply $V_{BUS}$ which, by way of example, is assumed to be 800 volts. However, VBUS may range from a few volts to several thousand volts. Note that the load includes an inductor connected in series with a resistance RL between terminals 16 and 20 and an overshoot protective diode DL connected across the load.

In FIG. 3, the turn-on and turn-off circuitry driving the IGBT includes gate driving circuitry which is operated between VDD volts and -VEE volts, where VDD volts is, typically, in the range of +12 to +16 volts and -VEE volts is, typically, in the range of -12 to -16 volts. In the embodiment of FIG. 3, the gate driving circuitry is connected to and responds to control circuitry operated between VCC volts and ground, where VCC may be, typically, in the range of 5-15 volts.

To better explain the invention, the operation of the circuit of FIG. 3 will now be discussed for the following conditions and in the following order:

(a) when the input signal (Vin) is low and the IGBT, T1, is turned off;

(b) when the input signal (Vin) is high and T1 is turned-on; and (c) when Vin is high and T1 is turned-on, but a short circuit condition (or the like) develops or is present.

(a) The normal turn-on and turn-off of the IGBT is controlled by an input signal ($V_{IN}$) applied to terminal 1. When the input signal (Vin) at node 1 is low, NPN bipolar transistor Q7 is turned-off. When Q7 is off, NPN bipolar transistor Q6 is turned on via resistors R1 and R2. This results in the LED of optocoupler U2 being placed in a non-conducting state. When optocoupler U2 is in the off state, the voltage at node 4 goes high (to ground) with respect to -VEE volts. When the voltage at node 4 goes high, zener diode Z3 breaks down in the reverse (zener) direction and current is supplied to the bases of NPN bipolar transistors Q1 and Q2; turning them both on hard. The turn-on of Q1 causes node 8 to be brought low. The low at node 8 cause transistor Q3 to be turned-off and also applies a low voltage to the cathode of diode D5 which, for this mode, functions to decouple the voltage at node 16 from affecting the operation of the voltage divider network (Z2 and Q3) and the comparator (A1). The voltage at node 8 will be a function of the ratio of resistors R10 and R11 forming a voltage divider. Transistor Q3 is turned off by means of zener diode Z2 conducting in the forward direction into node 8 and via resistor R11 and the collector to emitter of Q1 to ground. The turn-on of Q2 causes the potential at its collector (node 7) to be close to -VEE volts. This turns-on PNP transistor Q5 and turns-off NPN transistors Q8 and Q4. The turn-on of Q5 (and the turn-off of Q8 and Q4) functions to apply a negative voltage to the gate of the IGBT holding it in a fully off state.

The operation of "short circuit sensing and control" circuitry when the input signal ($V_{IN}$) is low, is briefly as follows. The non-inverting input of comparator A1 which is connected to node 14 is held at a reference voltage ($V_{Z1}$) determined by a zener diode Z1. This is due to the connection of resistor R9 between VDD volts and node 14 and the connection of the cathode of zener diode Z1 to node 14 and its anode to ground. For reasons to be detailed below, the zener voltage Vz1 of Z1 is designed and selected to be greater than the zener voltage Vz2 of zener diode Z2. For ease of illustration, in the discussion to follow it will be assumed that the zener voltage of Z1 (Vz1) is 10 volts and that the zener voltage of Z2 (Vz2) is equal to 8 volts. As noted above, when Q1 is turned-on, the inverting input of A1, which is connected to node 8, is held at a relatively low potential due to the voltage divider action of R10 and R11. Consequently, the output of comparator A1 (node 13) will be in the high state, at or close to VDD volts, and capacitor C2 (node 12) will be charged to, or close to, +VDD volts. Blocking diode D1 functions to decouple node 12 from node 7 which is held close to -VEE volts by Q2 which is turned on hard.

(b) When the input signal ($V_{IN}$) applied to node 1 goes sufficiently high with respect to control ground, it turns-on Q7 and Q6 turns-off. With Q6 turned-off, the LED in optocoupler U2 is on and supplies a turn-on signal to NPN transistor Q10 which is the output transistor of the optocoupler. When Q10 turns-on, it causes the voltage potential at node 4 to approach -VEE volts. This turns off Q1 and Q2. When Q2 is turned-off, the potential at node 7 can go high towards +VDD volts. This turns off Q5 and turns on NPN transistors Q8 and Q4. The turn-off of Q5 removes the negative voltage previously applied to the gate of the IGBT, T1. Concurrently, with Q2 turned off, resistor R6 connected to the base of Q8 couples essentially the full VDD volts to the base of Q8 which will then supply VDD less one VBE drop (e.g., 0.7 volts) to the base of Q4. Transistors Q8 and Q4 are connected as a darlington pair and are operated as emitter followers. Thus, the potential at the emitter of Q4 then goes to approximately 1.4 volts lower than +VDD volts resulting in the gate of the IGBT going to approximately 1.4 volts below +VDD volts. When VDD is +16 volts, the turn-on voltage applied to the gate of the IGBT (at node 11) is more than 14 volts. Consequently, the IGBT is turned-on hard and will be driven into saturation so that its $V_{CE}$ (at node 16) will be at $V_{CE(SAT)}$, which is assumed, by way of example, to be equal to 3 volts. It should be noted that the saturation voltage is typically in a range of 1.5 to 5 volts, varying somewhat as a function of the type of IGBT and the current level through it. Therefore, under normal operating conditions, when T1 is to be turned-on, a high positive voltage (e.g., 14–15 volts) is applied to its gate to drive it into saturation and its collector voltage will be a few volts above its emitter voltage.

During normal operation, in the absence of a short circuit, or similar, condition, the short circuit sensing and control circuitry functions as follows. The collector-to-emitter voltage of T1 is sensed by a diode DS connected at its cathode to node 16 (the collector of the IGBT) and at its anode via a resistor R3 to node 8 which is connected to the inverting input (−) of comparator A1. Since D5 is connected at its cathode to the collector of the IGBT, when T1 is on, D5 causes node 8, which is connected to the inverting input (−) of comparator A1, to be clamped to a voltage which is equal to the VCE(SAT) of the IGBT plus the forward voltage drop (Vf) of diode D5. Consequently, capacitor C1 (node 8) will also be charged to the relatively low voltage value of VCE(SAT) plus Vf. Therefore, when T1 is turned on, diode DS functions to sense the voltage at the collector of T1 and to couple that voltage to node 8 to which is connected a selectively enabled voltage divider network, which include Z2 and Q3, and a comparator circuit which includes A1.

So long as the VCE of T1 (i.e., the voltage at node 16) is less than a first voltage level corresponding to the zener voltage of Z2, transistor Q3 remains turned-off and the output (node 13) of comparator 13 is at, or close to, +VDD volts. Transistor Q3 is turned-off by means of a negative bias applied to its base via a resistor $R_B$. As for comparator A1, its non-inverting input is coupled to node 14 to which is applied a reference voltage corresponding to the zener voltage of Z1 which is assumed to be +10 volts. Thus, so long as node 8 which is connected to the inverting input of A1 is less than 10 volts, the output of A1 is close to VDD volts. Thus, D1 is reverse biased and node 7 is decoupled from nodes 12 and 13 and is not affected by Q3, and the full +VDD volts can be applied via Q8 and Q4 to the gate of IGBT, T1.

Therefore, under normal operation of the IGBT (i.e., in the absence of a fault condition), as the input signal toggles from high to low, the circuit will repeat the operation described above. That is, for a low or zero input signal, a voltage of -VEE volts is coupled to the gate of T1, while for a "high" input signal, a voltage of approximately VDD−2VBE is applied to the gate of T1, which is then driven into saturation.

The selection of the zener diode voltages (Z1 and Z2) is important for the desired operation of the circuit. Z1 is selected to have a higher zener breakdown voltage than that of Z2 (approximately 2 volts in the embodiment of FIG. 3). Z1 controls the reference (turn-on) voltage for the non-inverting (+) input (node 14) of comparator A1 and Z2 controls the voltage at which transistor Q3 is turned-on. Z1 is selected to have a higher zener breakdown than Z2 in order for Q3 to turn-on for approximately 500 nsec before the comparator A1 responds to an increase in the collector voltage of T1.

Figure 5:
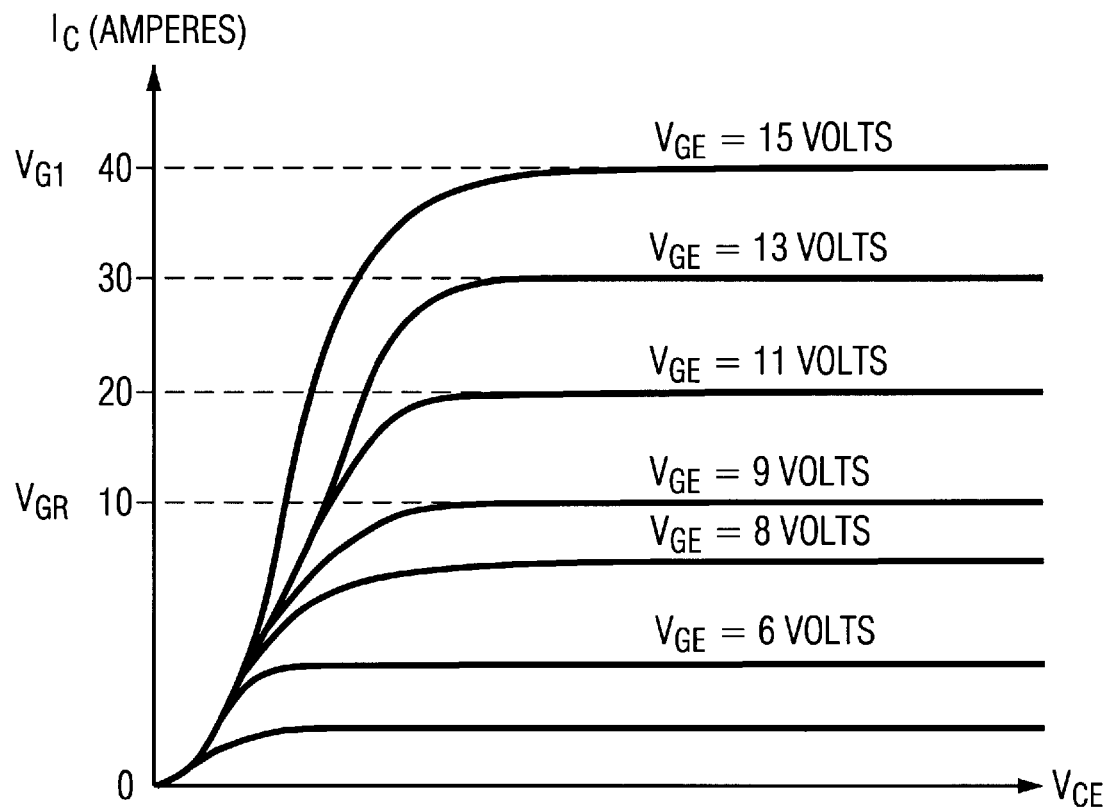
FIG. 5 is a waveform of the V-I characteristics of an IGBT for different values of gate voltage.

(c) The operation of the circuit of FIG. 3 will now be discussed for the condition where a short circuit exists or develops across the load while the IGBT is turned-on hard. Assume, for purpose of illustration, that the IGBT is biased to conduct a load current of 40 amperes. With the short circuit across the load, the collector voltage of the IGBT starts to increase from $V_{CESAT}$ towards $V_{BUS}$. The power dissipation across the IGBT $[(V_{CE})(I_L)]$ increases dramatically. However, as the $V_{CE}$ of the IGBT increases, the short circuit sensing and control begins to function. The voltage sensing action of diode D5 is such that the voltage at node 8 follows the increase in the collector voltage of T1 plus the forward voltage drop (Vf) due to D5. Consequently, capacitor C1 will also charge-up to the voltage of $V_{CE}$ of T1+Vf, as $V_{CE}$ increases. The voltage at node 8 follows with a time constant which is a function of R10 and C1. The voltage at node 8 is applied to the inverting input of comparator A1 and to the cathode of zener diode Z2. The zener breakdown voltage of diode Z2 (e.g., 8 volts) is selected to be less than the breakdown of Z1 (e.g., 10 volts). Consequently, zener diode Z2 will conduct in the reverse zener direction before the voltage at node 8 equals to, or exceeds, the voltage ($V_{Z1}$) at node 14. Thus, if, and when, the voltage at node 8 rises above the breakdown voltage of Z2, Q3 will turn-on. When Q3 turns-on, it causes the base voltage of Q8 to be pulled down by a ratio determined by R6, R7 and D11. Note that the turn-on of Q3, switches a voltage divider network into the circuit in order to lower the voltage at node 7 by a preset amount. The preset amount is such that the turn-on gate voltage supplied to the IGBT is lowered to some level above the threshold voltage ($V_T$) of the IGBT. Thus, as the collector voltage of T1 rises to the point that the voltage at node 8 exceeds 8 volts, the zener voltage of Z2 (e.g., 8 volts) is exceeded and diode Z2 breaks down in the reverse direction and causes the turn-on of Q3. When Q3 is turned-on, resistor R7 and diode D11 are switched into the circuit between node 7 and ground. This, effectively switches-in a resistor divider comprised of resistors R6 and R7 (ignoring D11 and Q3) into the circuit. By way of example, if R7 is twice the value of R6, the voltage at node 7 is decreased so that it is ⅔ its previous value. The decrease in the turn-on voltage applied to the gate of the IGBT causes a corresponding decrease in the collector current carried by the IGBT. The decrease in collector current is a function of a decrease in the gate voltage of the IGBT, as illustrated in FIG. 5. By way of example, referring to FIG. 5, reducing $V_{GE}$ from 15 volts to 11 volts causes the collector current to be decreased from 40 amperes to 20 amperes. The effect of lowering the $V_{GE}$ of the IGBT is to operate the IGBT at a "desaturated" condition or "desaturation". Thus, the sensing and control circuitry may also be termed "desaturation" circuitry.

Figure 4:
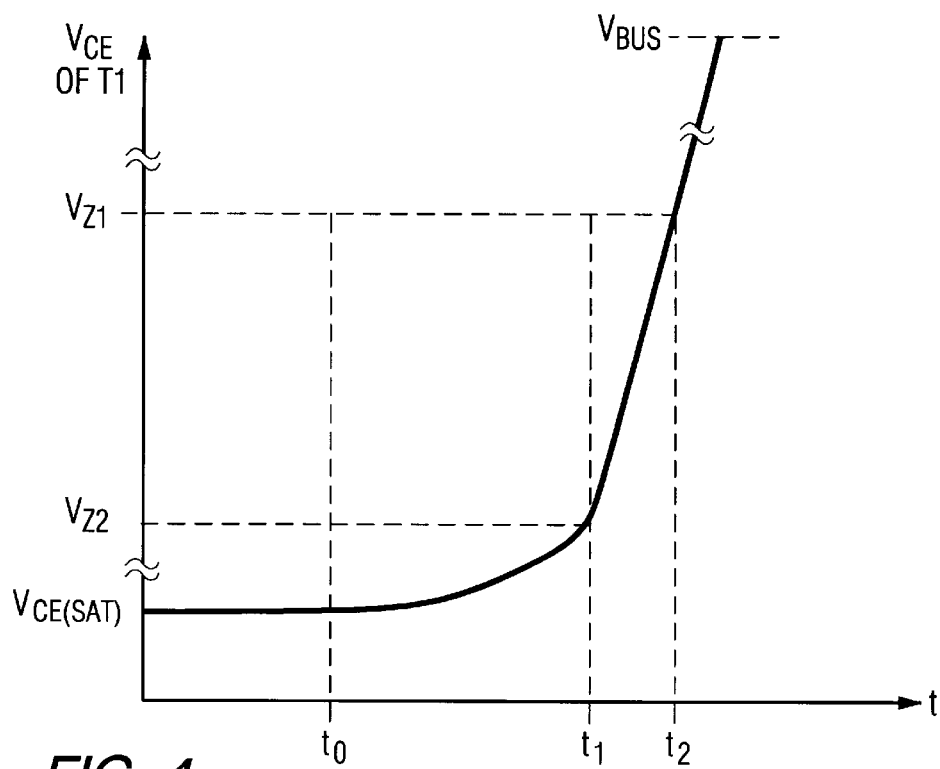
FIG. 4 is a waveform diagram showing an increase in the collector-to-emitter voltage of am IGBT subjected to a short circuit condition.

Therefore, by lowering the gate voltage (FIG. 5), the peak current of the device is limited, resulting in lower energy dissipation across the IGBT and therefore enabling safer turn-off. The power dissipation which the IGBT is rated to withstand is also a function of the length of time the IGBT is subjected to the dissipation. The lower the gate voltage, the lower the load current and the longer the device can remain in the short-circuit condition and still be turned-off safely. This is so, even though the Vce of the IGBT continues to rise more quickly after the collector current through the IGBT is decreased, as shown in FIG. 4 for the time after t1.

Figure 6:
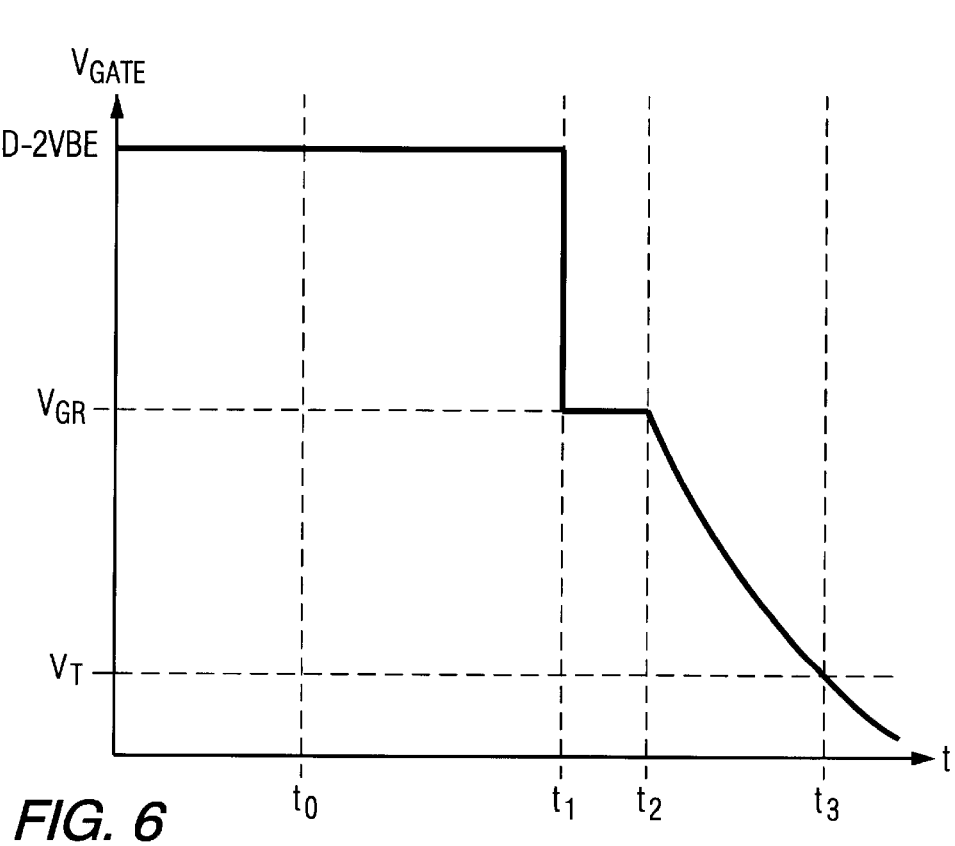
FIG. 6 is a is a waveform diagram of the gate drive produced by a circuit embodying the invention.

In the circuit of FIG. 3, Z1 is designed to have a higher breakdown voltage (e.g., 10 volts) than Z2 (e.g., 8 volts), to cause Q3 to turn-on approximately 500 nanoseconds before the voltage at the inverting (−) input terminal of A1 becomes more positive than the voltage at the non-inverting (+) input terminal of A1. Thus, as shown in FIGS. 4 and 6, following a short circuit condition, developed at a time $t_0$, Vce increases until it exceeds VZ2 at time t1. This causes the turn-on of Q3 and the gate voltage of T1 to be reduced to from (VDD−2VBE) volts to $V_{GR}$ volts. For the circuit of FIG. 3, $V_{GR}$ may be expressed approximately as (VDD) (R7)/(R7+R6). The gate voltage of the IGBT will remain at $V_{GR}$ for the time t1 to t2. As noted above, when the gate voltage of T1 is reduced at time t1 and its collector current is reduced, its Vce rises much faster towards $V_{BUS}$, as shown in FIG. 4. When the Vce of T1 increases (time t2 in FIGS. 4 and 6) such that the voltage at node 8 exceeds the voltage ($V_{Z1}$) at node 14, the output of A1 will switch to −VEE volts. When this occurs, capacitor C2 begins to discharge through R5 towards −VEE volts and the voltage at node 12 begins an exponential discharge towards −VEE volts. When the voltage at node 12 becomes more negative than the reduced voltage at node 7, diode D1 is now forward biased, pulling node 7 down towards −VEE volts. As the voltage at the base of Q8 decreases, the voltage at the gate of T1 also decreases, as shown for time t2 to t3 in FIG. 6. When the voltage at the gate of T1 decreases below the threshold voltage of T1, T1 is turned-off. Thus, as already noted, when Q3 turns-on, the gate voltage ($V_{GE}$) is first reduced from a high turn-on value (VDD−2VBE) designed to ensure saturation of T1 to a reduced value $V_{GR}$ to decrease the power dissipation through the IGBT and to prepare for a gradual and controlled turnoff of the IGBT. A benefit of slowly lowering the gate voltage is that the collector current will have a lower di/dt. The lower di/dt will tend to rduce any voltage overshoots. The voltage overshoot under fast turn-off could exceed the breakdown voltage of the IGBT resulting in failure of the device.

If the IGBT is turned-on directly into a short-circuit, the desaturation procedure (lowering the turn-on voltage of VDD−2VBE to a reduced voltage of $V_{GR}$) is exactly the same as above. The IGBT will turn-on with the collector voltage of the IGBT being at or close to the power supply voltage. However, the desaturation circuitry quickly lowers the turn-on voltage to the IGBT regardless of the input signal state.

Resistors R6, R7 and R5 and capacitors C2 and C1 can be designed for optimal performance depending on IGBT type. Zener diodes Z1 and Z2 can be selected to choose desired reference voltages for desaturation detection. The circuit of FIG. 3 may also include a circuit 95 shown connected to node 13 to produce a fault indication when a short circuit or similar fault condition occurs.

Circuits embodying the invention have several advantages over prior art short circuit detection gate circuits. They include: safer turn-off of the IGBT; faster response; lower cost; and lower turn-off loss under short-circuit condition. That is, the mean time between failures of an IGBT operated in accordance with the invention is significantly improved.

Figure 7:
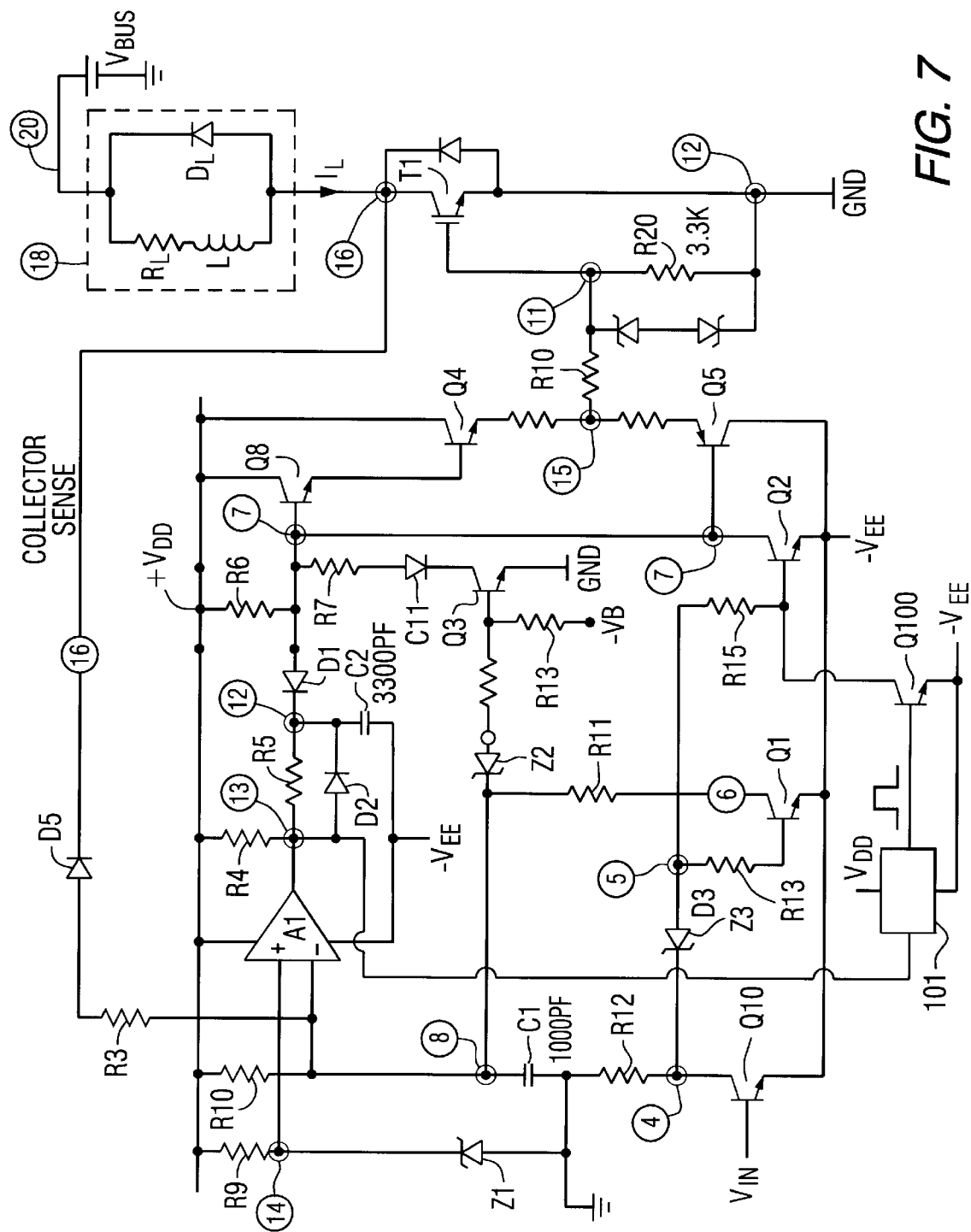
FIG. 7 is a schematic diagram of another circuit embodying the invention.

In the circuit of FIG. 7, an additional control circuit has been added. A monostable multi 101, operated between +VDD volts and −VEE volts, is connected at its signal input to output terminal 13 of comparator A1 and at its signal output to the base of an NPN transistor switch Q100. Q100 is connected at its collector to the base of Q2 and at its emitter to −VEE volts. Multi 101 is responsive to a negative going transistor at output terminal 13 to produce a positive going output pulse, which, for purpose of illustration, is assumed to have a duration of two (2) microseconds.

Hence, whenever terminal 13 goes negative, indicative of a large increase at the collector of the IGBT, Q100 will cause Q2 to be turned-off. Turning off Q2 prevents it from turning-on Q5 whose turn-on would couple −VEE volts to the gate of T1 and turn-it-off very sharply and very hard. Thus, the function of monostable multi 101 and Q100 is to ensure that whenever VCE exceeds a preset value indicative of a possible fault or short circuit, T1 is not turned-off sharply and very hard for a period of time (e.g., 2 microseconds).

Thus, it has been shown that circuits embodying the invention reduce the problem of turning-off an IGBT subjected to a fault condition by turning off the IGBT in two stages. First, the gate voltage is decreased to reduce the (short circuit) current flowing through the IGBT and the power dissipation through the IGBT, while still maintaining the IGBT conducting. Then the gate voltage is reduced to completely turn off the IGBT.

In the discussion above, T1 has been illustrated, by way of example, as an N-type device. However, it should be appreciated that T1 may be any other type of IGBT and that circuits embodying the invention may be used to drive and protect any IGBT. Also, the sensing and control method of the invention may be applied to any IGBT.

What is claimed is:

1. A combination comprising:
   an insulated-gate bipolar transistor (IGBT) having first and second electrodes defining the ends of the main conduction path of the IGBT, and having a control electrode for the application thereto of a control voltage for turning the IGBT on and off; said IGBT being characterized in that a voltage applied between the control and second electrodes must exceed a certain threshold voltage (VT) in order to turn-on the IGBT and in that it has a saturation voltage, $V_{SAT}$, which is in the range of a few volts;

means for coupling a load between the first electrode of the IGBT and a load power supply terrninal;

means connecting the second electrode of the IGBT to a point of reference potential;

means for applying a turn-on voltage to the control electrode of the IGBT which is significantly greater than the threshold voltage of the IGBT for operating the IGBT in saturation;

means coupled to the first electrode of the IGBT for sensing its voltage level and which is responsive to the voltage at the first electrode exceeding the saturation voltage by a first amount for: appling a preset reduced voltage to the control electrode of the IGBT, said preset reduced voltage being less than said turn-on voltage by a preset amount and being greater than the threshold voltage; and being responsive to the voltage at the first electrode exceeding the saturation voltage by a second amount which is greater than said first amount to gradually decrease the preset reduced voltage applied to the control electrode below the threshold voltage of the IGBT in order to turn it off completely; and wherein said preset reduced voltage is gradually decreased by the gradual discharge of a resistive capacitance (RC) network; where the capacitance of the network includes a distinct, independently manufacture, component, having a capacitance which is substantially greater than the typical gate to source capacitance of a metal oxide field effect transistor, and wherein said gradually decreasing voltage is coupled to the control electrode of the IGBT.

2. A combination as claimed in claim 1, wherein said means for applying a preset reduced voltage to the control electrode of the IGBT includes switching means and voltage divider means.

3. A combination as claimed in claim 2, wherein said means for gradually decreasing the preset reduced voltage applied to the control electrode includes time delay means for applying said preset reduced votage a predetermined time delay after first decreasing the turn-on voltage.

4. A combination as claimed in claim 3, wherein said means for gradually decreasing the preset reduced voltage applied to the control electrode includes the discharging of a capacitor via a resistor.

5. A combination as claimed in claim 1, wherein said first electrode is the collector electrode of the IGBT and said second electrode is the emitter electrode of the IGBT.

6. A combination as claimed in claim 5, wherein said point of reference potential is ground potential.

7. The combination as claimed in claim 1, wherein said first amount is a fixed
voltage level relative to a reference potential.

8. The combination as claimed in claim 1 wherein said first amount is independent of the turn-on voltage applied to the control electrode of the IGBT.

9. The combination as claimed in claim 1 wherein said means for applying a turn-on voltage to the control electrode of the IGBT includes means responsive to an input signal for applying a first fixed amplitude signal to the control electrode which is independent of the amplitude of the input signal; and wherein the means responsive to the voltage at the first electrode exceeding the saturation voltage by a second amount includes means responsive to a fixed predetermined voltage level, independent of the amplitude of the input signal.

10. A method for turning-off an insulated gate bipolar transistor (IGBT) having collector and emitter electrodes defining the ends of its main conduction path and a gate electrode, when it is subjected to a short circuit condition while turned-on to operate in saturation, comprising the steps of:

sensing when the voltage at the collector of the IGBT exceeds a first value for applying a preset reduced voltage which is a less than said turn-on voltage to the gate of the IGBT and which still leaves the IGBT conducting; and then sensing when voltage at the collector exceeds a second value which is greater than the first value for gradually decreasing the preset reduced voltage applied to the gate of the IGBT relative to its emitter until it is turned-off completely; wherein said reduced voltage is gradually decreased by a resistive capacitive network whose capacitance includes a distinct, independently manufactured, component having a capacitance which is substantially greater than the typical gate to source capacitance of a metal oxide field effect transistor.

11. The combination as claimed in claim 10, wherein said first value is a fixed predetermined voltage level relative to a reference potential.

12. A circuit for turning off an IGBT having collector, emitter and gate electrodes when it is operated in circuit and its load is subjected to a short circuit condition comprising:

means coupled between the collector and gate electrodes of the IGBT for sensing when the voltage at the collector electrode of the IGBT rises above a first predetemiined value for applying a preset reduced voltage to the electrode of the IGBT, while still maintaining the IGBT in conduction, and means for sensing when the voltage at the collector electrode of the IGBT rises above a second predetermined value greater than said first predetermined value for gradually decreasing said preset reduced voltage applied to the gate electrode of the IGBT to thereby turn off the IGBT completely; wherein said preset reduced voltage is gradually decreased by a resistive capacitive network, where the capacitance of the network includes a distinct, independently manufactured, component having a value which is substantially greater than that of the typical gate to source capacitance of a metal oxide field effect transistor.

13. A combination comprising:

an insulated-gate bipolar transistor (IGBT) having first and second electrodes defining the ends of the main conduction path of the IGBT, and having a control electrode for the application thereto of a control voltage for turning the IGBT on and off; said IGBT being characterized in that a certain voltage applied between the control and second electrodes must exceed a certain threshold voltage (VT) in order to turn on the IGBT and in that it has a saturation voltage, $V_{SAT}$, which is in the range of a few volts;

means for coupling a load between the first electrode of the IGBT and a load power supply terminal;

means connecting the second electrode of the IGBT to a point of reference potential;

gate driving means coupled to the control electrode of the IGBT for normally applying a turn-on voltage to the control electrode of the IGBT which is significantly greater than the threshold voltage of the IGBT for operating the IGBT in saturation, sensing and control means coupled between the first electrode of the IGBT and the gate driving means for sensing when the voltage level at the first electrode exceeds a first value for applying a preset reduced voltage to the control electrode of the IGBT, said preset reduced voltage being less than said turn-on voltage by a preset amount and being greater than the threshold voltage; and for sensing when the voltage at the first electrode exceeds a second value said second value being greater than said first value, for then gradually decreasing the preset reduced voltage applied to the control electrode to a level below the threshold voltage of the IGBT in order to turn it off completely; wherein said preset reduced voltage is gradually decreased by a resistive capacitive network, where the capacitance of the network includes a distinct, independently manufactured, component, having a value which is substantially greater than that of the typical gate to source capacitance of a metal oxide field effect transistor.

14. The combination as claimed in claim 13 wherein said turn-on voltage is of fixed amplitude; and wherein the gate driving means for sensing when the voltage level at the first electrode exceeds a first value, wherein the first value is a fixed voltage having a predetermined value.

15. The combination of claim 13, wherein said sensing and control means comprises:

a first zener diode having a first reverse break down voltage, said first zener diode conducting when the voltage level at the first electrode exceeds said first reverse break down voltage to thereby apply said preset reduced voltage to the control electrode of the IGBT; and a comparator having an inverting input and a noninverting input, said noninverting input being connected to a reference voltage, said inverting input electrically connected to said first zener diode, said first reverse break down voltage being less than said reference voltage such that conduction of said first zener diode occurs prior to the voltage level at the first electrode of the IGBT exceeding said reference voltage, said comparator having an output which changes state when said voltage level at the first electrode of the IGBT exceeds said reference voltage to thereby gradually decrease said preset reduced voltage applied and turn the IGBT completely off.

16. The combination of claim 15, further comprising a second zener diode having a second reverse breakdown voltage, said second reverse breakdown voltage being greater than said first reverse breakdown voltage, said second zener diode establishing said reference voltage.

* * * * *